(12) United States Patent
Suto

(10) Patent No.: US 8,760,183 B2
(45) Date of Patent: Jun. 24, 2014

(54) FAST OPEN CIRCUIT DETECTION FOR OPEN POWER AND GROUND PINS

(75) Inventor: Anthony J. Suto, Sterling, MA (US)

(73) Assignee: Teradyne, Inc., North Reading, MA (US)

( * ) Notice: Subject to any disclaimer, the term of this patent is extended or adjusted under 35 U.S.C. 154(b) by 358 days.

(21) Appl. No.: 13/122,423

(22) PCT Filed: Nov. 13, 2009

(86) PCT No.: PCT/US2009/006101
§ 371 (c)(1),
(2), (4) Date: Apr. 4, 2011

(87) PCT Pub. No.: WO2010/056343
PCT Pub. Date: May 20, 2010

(65) Prior Publication Data
US 2011/0210759 A1    Sep. 1, 2011

Related U.S. Application Data

(60) Provisional application No. 61/115,011, filed on Nov. 14, 2008.

(51) Int. Cl.
*G01R 31/20* (2006.01)
(52) U.S. Cl.
USPC ................................. 324/754.03
(58) Field of Classification Search
USPC ................................ 324/754.03
See application file for complete search history.

(56) References Cited

U.S. PATENT DOCUMENTS

| | | | |
|---|---|---|---|
| 5,101,153 A | * | 3/1992 | Morong, III ............ 324/537 |
| 5,124,660 A | * | 6/1992 | Cilingiroglu .......... 324/538 |

(Continued)

FOREIGN PATENT DOCUMENTS

| EP | 1022571 A2 | 7/2000 |
|---|---|---|
| FR | 2817352 A1 | 5/2002 |

OTHER PUBLICATIONS

International Search Report and Written Opinion for PCT/US2009/006101 mailed Jun. 28, 2010.

(Continued)

*Primary Examiner* — Patrick J Assouad
*Assistant Examiner* — Demetrius Pretlow
(74) *Attorney, Agent, or Firm* — Wolf, Greenfield & Sacks, P.C.

(57) ABSTRACT

A system and method for identifying opens among parallel connections on a circuit assembly such as a printed circuit board (PCB). In a learn phase performed on a known good circuit assembly, a group of parallel connected pins are excited with a first signal. A second signal, out-of-phase with the first signal, is applied to a second group of pins associated with the component. The amplitude and/or the phase of the second signal and the number and/or specific pins in the second group of pins are selected so that first and second signals coupled to a detector plate proximal to the component substantially offset. During a manufacturing test, signals of comparable amplitude and phase are applied to like pins on a like component of a circuit assembly under test. If the response signal coupled to a like detector plate is below a threshold, it is determined that each pin in the group of parallel connected pins is connected. If the amplitude of the response is over the threshold, one or more of the parallel pins is determined to be open. Additional tests may be performed to identify which of the parallel pins is likely open.

28 Claims, 7 Drawing Sheets

(56) References Cited

U.S. PATENT DOCUMENTS

| | | | |
|---|---|---|---|
| 5,254,953 A * | 10/1993 | Crook et al. | 324/538 |
| 5,486,753 A | 1/1996 | Khazam et al. | |
| 5,517,109 A * | 5/1996 | Albean et al. | 324/750.3 |
| 5,517,110 A | 5/1996 | Soiferman | |
| 5,578,930 A * | 11/1996 | Sheen | 324/530 |
| 5,608,337 A * | 3/1997 | Hendricks et al. | 324/762.03 |
| 5,621,312 A * | 4/1997 | Achor et al. | 324/750.06 |
| 5,631,572 A * | 5/1997 | Sheen et al. | 324/754.08 |
| 5,736,862 A * | 4/1998 | Hamblin | 324/527 |
| 6,104,198 A * | 8/2000 | Brooks | 324/538 |
| 6,144,210 A * | 11/2000 | Brooks | 324/519 |
| 6,194,911 B1 * | 2/2001 | Currin et al. | 324/762.02 |
| 6,462,556 B2 * | 10/2002 | Yamashita et al. | 324/537 |
| 6,998,849 B2 * | 2/2006 | Tesdahl et al. | 324/519 |
| 7,019,547 B2 * | 3/2006 | Aghaeepour | 324/750.01 |
| 7,061,250 B2 * | 6/2006 | Tesdahl et al. | 324/530 |
| 7,227,364 B1 | 6/2007 | Fan et al. | |
| 7,279,921 B1 * | 10/2007 | Iacob | 324/762.03 |
| 7,307,427 B2 * | 12/2007 | Jacobsen et al. | 324/519 |
| 7,855,567 B2 * | 12/2010 | Tsai et al. | 324/754.1 |
| 2002/0132382 A1 * | 9/2002 | Hebert et al. | 438/17 |
| 2003/0146763 A1 * | 8/2003 | Sunter | 324/527 |
| 2004/0123197 A1 * | 6/2004 | Sunter et al. | 714/724 |
| 2005/0099186 A1 | 5/2005 | Parker et al. | |
| 2005/0134301 A1 | 6/2005 | Lopezdenava | |
| 2005/0206394 A1 * | 9/2005 | Arora et al. | 324/658 |
| 2006/0006894 A1 * | 1/2006 | Ho et al. | 324/755 |
| 2006/0076960 A1 * | 4/2006 | Tesdahl et al. | 324/519 |
| 2006/0125499 A1 * | 6/2006 | Shibuya | 324/754 |
| 2006/0152244 A1 * | 7/2006 | Neaves et al. | 324/765 |
| 2007/0001687 A1 * | 1/2007 | Schneider et al. | 324/605 |
| 2007/0007978 A1 * | 1/2007 | Parker et al. | 324/754 |
| 2007/0013383 A1 * | 1/2007 | Parker et al. | 324/519 |
| 2007/0018672 A1 * | 1/2007 | Jacobsen et al. | 324/765 |
| 2008/0079455 A1 * | 4/2008 | Vollrath et al. | 324/763 |
| 2008/0204033 A1 | 8/2008 | Burlak et al. | |
| 2008/0218175 A1 * | 9/2008 | Chen et al. | 324/538 |
| 2009/0079440 A1 * | 3/2009 | Williamson et al. | 324/612 |

OTHER PUBLICATIONS

First Office Action in Chinese Patent Application No. 200980144887.9 issued Feb. 28, 2013.
Office Action from Chinese Patent Application No. 200980144887.9, dated Oct. 17, 2013, 4 pages.
Extended European Search Report from European Application No. EP 09826437, dated Oct. 2, 2013, 7 pages.
Communication pursuant to rules 70(2) and 70a(2) EPC in European Application No. EP 09826437, dated Oct. 18, 2013, 1 page.

* cited by examiner

FAST OPEN CIRCUIT DETECTION FOR OPEN POWER AND GROUND PINS

BACKGROUND

1. Field of the Invention

The invention relates generally to printed circuit board testing, and more particularly to identifying opens in parallel connections.

2. Description of Related Art

During the manufacture of printed circuit board (PCB) assemblies, testing is performed at one or more stages to ensure that the finished product functions adequately. In some manufacturing operations, PCBs are first tested before any components are mounted to them. The components may be separately tested before they are attached to the PCBs, usually by soldering. Once the components are attached, a further test may be performed to verify that the components are properly attached. Such testing includes "opens" tests in which a determination is made whether all the contact points of the components are appropriately connected to the PCB.

Detecting open solder connections to components, such as integrated circuit devices, connectors, and sockets, on printed circuit board (PCB) assemblies continues to be a major challenge on today's manufacturing floor. Conventionally, automated testing to detect open connections, sometimes called open "pins," has been performed by connecting test probes to the PCB assembly and measuring electrical parameters between two or more test points on the PCB assembly. For example, to determine whether a pin is open, test probes may be connected such that a path between the probes should include the pin to be tested, if the pin is properly connected to the PCB. By measuring a parameter, such as the impedance of the path, a determination may be made whether the pin is open. Such an approach is sometimes called an impedance test.

An alternative approach to automated testing for open pins is called a capacitive test. Such a test may be performed by exciting a sinusoidal test signal on a circuit trace of the PCB and measuring the amount of that signal capacitively coupled to a detector plate positioned above an integrated circuit device mounted to the PCB. If a pin is connected to the trace, the test signal can propagate from the trace, through the pin to a lead frame within the integrated circuit device. From the lead frame, the test signal will capacitively couple to the detector plate. The magnitude of the detected signal can be analyzed to determine if the connection between the pin and trace is good. For example, the amplitude of the detected signal at a test frequency may be compared to a threshold value. A detected signal above the threshold may be interpreted as a good connection. Similarly, a detected signal below the threshold may indicate the pin is open.

However, when a component has multiple pins connected in parallel, conventional capacitive or impedance test techniques cannot readily identify open pins because the parallel connected pins effectively mask the open. For example, connectors and integrated circuit sockets frequently have multiple power pins or ground pins connected in parallel. Even if one of these parallel power or ground pins is open, the remaining parallel connected pins couple the test signal to the component, allowing an ample signal to reach the detector plate. The detected signal in a capacitive test has an amplitude that cannot reliably be distinguished from the magnitude of the signal that would be expected if all of the pins were properly connected. A similar problem occurs with impedance tests. Even if some parallel connected pins are opens, the effect on measured impedance is not large enough to reliably detect, thereby masking the presence of the open pin.

Though test techniques are known for detection of open pins in parallel with other pins, these techniques have generally required extensive probing of an assembly under test. The test techniques sometimes required active measures to isolate sections of a PCB, which could be slow and could entail risk of damage to components on the PCB. Because the impact of an open pin when there are other pins connected in parallel was regarded as relatively minor, and because of the drawbacks of these test techniques, such techniques have not been widely applied.

SUMMARY

A fast and reliable method is provided for identifying opens among parallel connections on a circuit assembly such as a PCB assembly. The method uses a detector plate positioned adjacent a component as may be used in a conventional capacitive test. However, unlike a conventional capacitive test, a combination of test signals may be applied to multiple traces to which pins of the component, including the pins connected in parallel, are connected on a good PCB assembly. The combination of test signals is selected such that, if all of the pins are properly connected, the coupled signal will have an identifiable value. Deviations from this identifiable value are detected and used as an indication of an open connection. In accordance with some embodiments, the applied test signals have amplitudes and phases such that the identifiable value is a null value, allowing deviations from the identifiable value to be identified if a voltage is coupled to the detector plate.

In some embodiments, the amplitudes, phases and number of pins to which the test signals are applied are determined during a learn phase performed using a known "good" circuit assembly. In the learn phase, a first group of parallel connected pins for a component are excited with a first signal. A second signal, out-of-phase with the first signal, is applied to a second group of pins of the component. The amplitude of the second signal and the pins comprising the second group of pins are selected to null a response signal capacitively coupled to a detector plate proximal to the component. During testing of a PCB assembly under test, signals with the same amplitudes and phases are applied to like pins on a like component of a PCB assembly under test. If the response signal detected at the plate deviates from the identifiable value by less than a threshold amount, it is determined that all pins in the first group of pins are connected. If the amplitude of the response deviates from the identifiable value by more than the threshold amount, the first group of pins fails, indicating that one or more of the pins in the first group is open. Additional tests may be performed to identify which of the pins in the first group is likely open.

In some aspects, the invention relates to a method of testing a circuit assembly comprising a component with a plurality of pins. The method comprises applying a first signal to a first group of the plurality of pins; concurrently with applying the first signal, applying a second signal to a second group of the plurality of pins, the second signal being out of phase with the first signal; with a probe positioned adjacent the component, sensing a response signal, the response signal being in response to the first signal and the second signal as capacitively coupled to the probe from the first group and the second group, respectively; and indicating a test result based on a level of the response signal.

In another aspect, the invention relates to a method of testing a circuit assembly comprising a component with a plurality of pins. The method comprises a learn phase and a test phase. During the learn phase the method comprises identifying a first group and a second group of the plurality of pins such that when a signal is applied to each of the pins in the first group and a signal of a complementary phase is applied to each of the pins in the second group, the signals coupled from the first group and the second group to a probe adjacent the component have a predetermined value. During the test phase the method comprises applying a first signal to the first group of the plurality of pins; concurrently with applying the first signal, applying a second signal to the second group of the plurality of pins, the second signal being out of phase with the first signal; with a probe positioned adjacent the component, sensing a response signal, the response signal being representative of a combined level of the first signal and the second signal coupled from the first group and the second group, respectively; and indicating a test result based on the level of the response signal relative to the predetermined value.

In yet another aspect, the invention relates to a computer storage medium comprising computer executable instructions that, when executed on a test system having a computer, control the test system to test a circuit assembly according to a method. The method comprises applying a first signal to a first group of the plurality of pins; concurrently with applying the first signal, applying a second signal to a second group of the plurality of pins, the second signal being out of phase with the first signal; with a probe positioned adjacent the component, sensing a response signal, the response signal being in response to the first signal and the second signal as capacitively coupled to the probe from the first group and the second group, respectively; and indicating a test result based on a level of the response signal.

BRIEF DESCRIPTION OF DRAWINGS

The invention and embodiments thereof will be better understood when the following detailed description is read in conjunction with the accompanying drawing figures. In the figures, elements are not necessarily drawn to scale. In general, like elements appearing in multiple figures are identified by a like reference designation. In the drawings.

DETAILED DESCRIPTION

Figure 1:
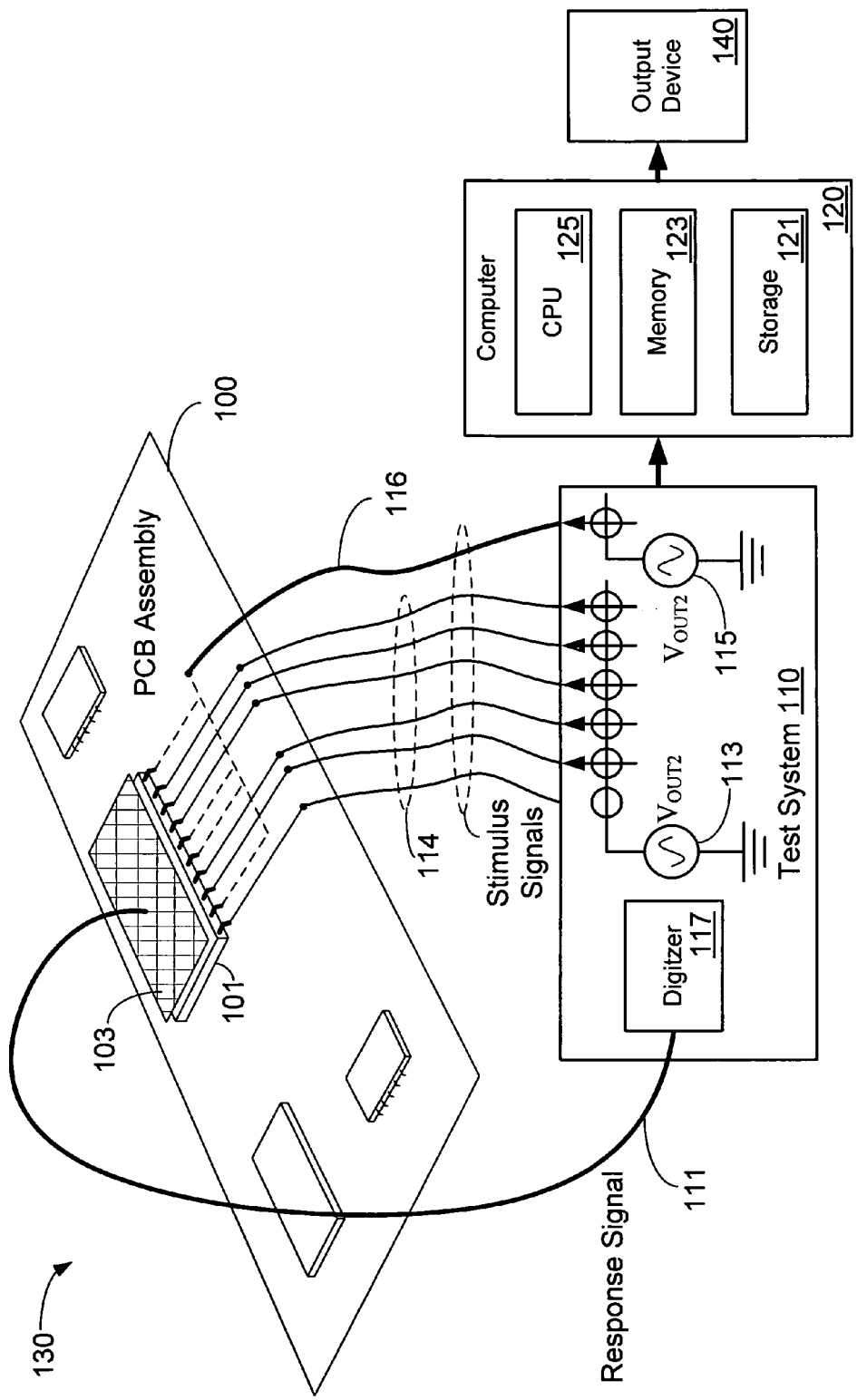
FIG. 1 is a sketch of a test setup according to some embodiments.

As high-speed signals have become more widely used in electronic systems, conventional test strategies that forego testing for opens in parallel pins have become unacceptable. The proximity of power and ground structures to conductors carrying signals in a circuit assembly impacts the integrity of those signals. If some power or ground pins are open, the intended proximity of signal conductors to power or ground is disrupted. Accordingly, ensuring that all power and ground pins are connected plays a critical role in achieving reliable, high-speed signaling. However, detection of an open pin among the parallel connected power or ground pins is not readily achieved using conventional capacitive opens or impedance measurement techniques because the parallel connections effectively mask the open connection.

The inventor has recognized and appreciated that an open can be detected, even if multiple pins are connected in parallel, using in-phase and out-of-phase excitation signals in combination with capacitive coupling. According to some embodiments, an in-phase signal is applied to one or more traces on the circuit assembly to which the group of parallel pins is connected on a good PCB assembly. An out-of-phase signal is applied to the traces on the circuit assembly to which the pins of the second group are connected on a good PCB assembly. The members of the second group of pins to which the out-of-phase signal is applied are selected such that the signals capacitively coupled to a probe proximal the component from the pins of the first and second groups cancel if all of the pins are properly connected. A deviation from the expected value, which is a null in these embodiments, indicates that some of the pins are open.

The members of the second group of pins may be determined during a "learn phase" for which a good PCB assembly is used. In addition to selecting the members of the second group of pins, the amplitude of the in-phase and/or out-of-phase signal may be adjusted to identify test signals that yield an expected value that is a null or as close to a null as practical.

During a "test phase," which typically occurs during the manufacture of a PCB assembly, the in-phase and out-of-phase signals are applied to a PCB assembly under test to determine whether any parallel connections are open. A capacitively coupled signal will be measured, and a null measured signal will indicate that all the parallel pins of the component are connected. In contrast, an open connection among the group of parallel connected pins will deviate from the null, and result in a detectable signal coupled to the detector plate.

A single test can be performed for each group of parallel connected pins to verify the electrical connections. In this way, the test for each group of parallel pins in a component can be performed quickly. If any open pins are detected, further testing may be performed to locate the open pin. Though location may take additional time, a very large percentage of PCB assemblies tested in a manufacturing operation do not have open pins. Accordingly, quickly determining whether there are any open pins in a group of parallel pins can speed testing of PCB assemblies on average. Though, if an open is detected on a PCB assembly, the assembly may be routed for rework or other corrective action may be taken.

Turning now to FIG. 1, an illustration of a test setup 130 for performing an opens test according to some embodiments is illustrated. Test techniques as described below may include multiple phases, such as a learn phase, a test phase and a location phase. Test setup 130 may be used in any of these phases. In some instances, the same equipment may be used in establishing the test setup for each of the phases. However, in other embodiments, the different phases may be performed at different times and in different places with different equipment.

The test setup includes an automatic test system 110 for generating the stimulus signals on leads, such as 114 and 116, that are coupled to test points on a PCB assembly 100 under test. The test setup 130 also includes leads, such as leads 111, coupling a response signal from a detector plate 103 to the test system 110. Although detector plate 103 is shown in FIG. 1 and referred to herein, it should be appreciated that any suitable type of testing probe may be used. Test setup 130 may incorporate test components as is known in the art for performing capacitive testing. However, any suitable test setup may be used.

Lead 111 may be connected to a digitizer 117 of the test system 110. Digitizer 117 may be configured to filter, amplify and digitize a signal received on lead 111. Digitizer 117 may be implemented in test system 110 using any suitable combination of hardware and software components.

Though not expressly illustrated in FIG. 1, test setup 130 may include mechanical components to hold PCB assembly 100. Additionally, mechanical components may be provided to position detector plate 103 and also to make contact between leads 114 and 116 and test points on PCB assembly 100. A conventional printed circuit board test fixture adapted for capacitive testing may be used for this purpose. However, any suitable mechanical components may be used.

In the embodiment illustrated, lead 116 is connected to a net on PCB assembly 100 to which multiple pins of a component 101 are connected in parallel. Component 101 may be an integrated circuit (IC) unit, a connector, a socket, or any other suitable structure having pins connected to the PCB assembly. For example and not limitation, component 101 may be a PCI Express socket, DDR SDRAM socket, or SATA socket. Leads 114 carry a signal to other pins within component 101. In the configuration illustrated, test system 110 generates stimulus signals on leads 114 and 116 that are intended to substantially offset when capacitively coupled to detector plate 103. For example, lead 116 may be connected to an in-phase signal generator 115 while leads 114 may be selectively connected to an out-of-phase signal generator 113. In this way, processing of the response signal coupled to test system on lead 111 can indicate whether any of the pins of the group of parallel connected pins is open. Such processing may be performed within test system 110. However, as indicated in FIG. 1, a test system may further include a computer 120 with storage media 121, memory 123, and processing unit 125, and such processing may be performed in computer 120 or any other computing device.

Storage media 121 and memory 123 may be any suitable computer-readable storage medium, such as, for example and not limitation, a computer memory, one or more floppy discs, compact discs, optical discs, magnetic tapes, flash memories, circuit configurations in Field Programmable Gate Arrays or other semiconductor devices, or other tangible computer storage medium. In some embodiments, a computer-executable instruction is loaded from storage media 121 to memory 123 before execution by processing unit 125. However, a distinction between storage media 121 and memory 123 is not critical and either or both may be present in some embodiments.

Processing unit 125 may be any suitable processing device, such as, for example and not limitation, one or more processors, a central processing unit (CPU), digital signal processor (DSP), controller, addressable controller, general or special purpose microprocessor, microcontroller, addressable microprocessor, programmable processor, programmable controller, dedicated processor, dedicated controller, or any other suitable processing device.

Storage media 121 may store program commands for computer 120. When these program commands are executed, computer 120 may control test system 110 to generate stimulus signals and measure and analyze response signals as described herein.

Regardless of which components perform the processing, once a test result is obtained, the result may be stored in storage media 121 or provided as an output. An output device 140 may be provided so that the test results may be output to a user. The output may be provided in any suitable format, such as an indication that a specific PCB assembly has failed an opens test or as a report aggregating test information for multiple PCB assemblies that were tested. Additionally, an output from a test system may be provided to other components in a manufacturing process, which may control further processing of a PCB assembly based on the results of a test. A faulty PCB assembly, for example, may be routed for rework. A good PCB assembly, on the other hand, may be routed to other stages in the manufacturing operation, such as where the PCB assembly may be packaged for shipment.

FIG. 1 shows test setup 130 configured for testing one component 101. However, as is known in the art, an automatic test system may support numerous input and output connections. Accordingly, the test setup may be configured to test any number of components, either simultaneously or sequentially on the same PCB assembly.

Figure 2:
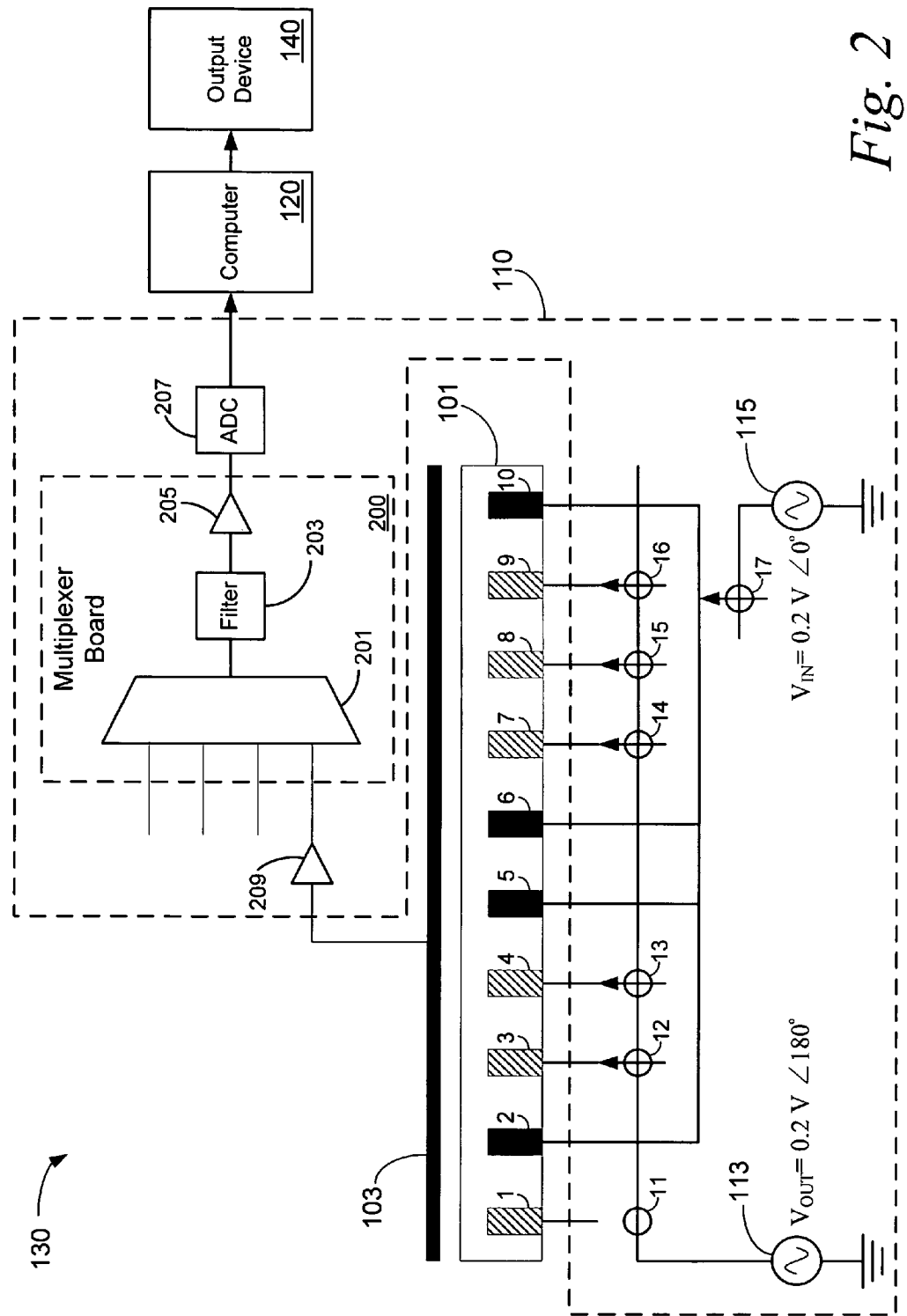
FIG. 2 is a schematic illustration of the test setup of FIG. 1.

FIG. 2 provides a more detailed view of aspects of the test setup 130 according to some embodiments. Illustrated is an example component 101 having ten pins, some of which are connected in parallel (pins 2, 5, 6, and 10) and others which are not (pins 1, 3, 4, 7, 8, and 9). In the illustrated embodiment, the pins connected in parallel are power pins and the remaining pins, which may be electrically separate with respect to each other, are signal pins. However, the function of the pins is not critical to the invention, which may be applied to any assembly under test in which groups of pins are connected in parallel.

As illustrated in FIG. 2, test system 110 is configured to generate an in-phase signal, $V_{OUT22}$, on the parallel connected pins (pins 2, 5, 6, and 10) and an out-of-phase signal, $V_{OUT1}$, on the signal pins (pins 3, 4, 7, 8, and 9). Signal generators 113 and 115 may be used for this purpose. Signal generators 113 and 115, as with other components of test system 110, may be controlled based on a program executed on computer 120 or in any other suitable way. In the illustrated embodiment, both the amplitude and phase of the signals generated by signal generators 113 and 115 may be controlled. As illustrated in FIG. 2, the signal generators 113 and 115 have been set so that each generates a signal with approximately equal magnitude but of opposite phase. In some embodiments, signal generators 113 and 115 are digital drivers of the test system 110.

Signals from signal generators 113 and 115 may be coupled to a PCB assembly using known techniques. Here, switch 17, shown closed, connects the in-phase signal generator 115 with the group of power pins. Switches 11, 12, 13, 14, 15, and 16 within test system 110 are selectively controlled to each connect a corresponding signal pins to the out-of-phase signal generator 113. In the operating state illustrated, switches 12, 13, 14, 15, and 16 are shown in the "closed" position so that an out-of-phase signal, $V_{OUT2}$, from signal generator 113 is coupled to each of pins 2, 5, 6, and 10. Switch 11 is shown in the "open" position so that the out-of phase signal generator 113 is disconnected from pin 1. Switches 11-17 may be semiconductor devices, relays, or switches implemented with any other suitable technology that permits a voltage signal to be passed or blocked. In other operating states, these switches may be opened or closed to reduce or increase the number of pins in the group connected to signal generator 113. Thus, test system 130 provides a mechanism for signals of controlled characteristics to be coupled to at least two groups of pins of a component and also for the pins in at least one of those groups to be selected.

A response signal also may be measured using known techniques. Here, detector plate 103 is placed above component 101. The in-phase and out-of-phase signals are coupled to the detector plate from the connected power and signal pins, respectively. The coupled signal is buffered by buffer 209 before entering a multiplexer board 200 of the test system 110. In some embodiments, the buffer 209 may be integrated with the detector plate 103. Although only a buffer is shown, any suitable signal conditioning components may be included.

When the component 101 is being tested, the multiplexer 201 selects the input corresponding to buffer 209. The buffered signal is then filtered (filter 203) and amplified (amplifier 205) before being digitized by analog-to-digital converter (ADC) 207. Further processing of the digitized signal as appropriate to the learn, test, or localization phase is performed by the computer 120. Detector plate 103, multiplexer board 200 and ADC 207 may be components as are known in the art for capacitive testing of PCB assemblies, though any suitable components may be used.

Here, multiplexer board 200 is shown to have multiple inputs, though only one input is shown connected. Multiplexer board 200 facilitates testing of pins associated with multiple components on a PCB assembly under test. For example, a test setup may include multiple detector plates, each adjacent a component. Multiplexer board 200 allows test system 110 to measure response signals at different detector plates at different times. Similarly, though not expressly shown, test system 110 may include more switches than shown, and possibly more signal generators than shown, allowing stimulus signals to be generated for testing pins associated with multiple components. Because the same test process may be used for each component, testing is described in connection with a single component for simplicity. However, it should be understood that pins associated with other components could be tested in a similar fashion, whether at the same time or different times.

Figure 3:
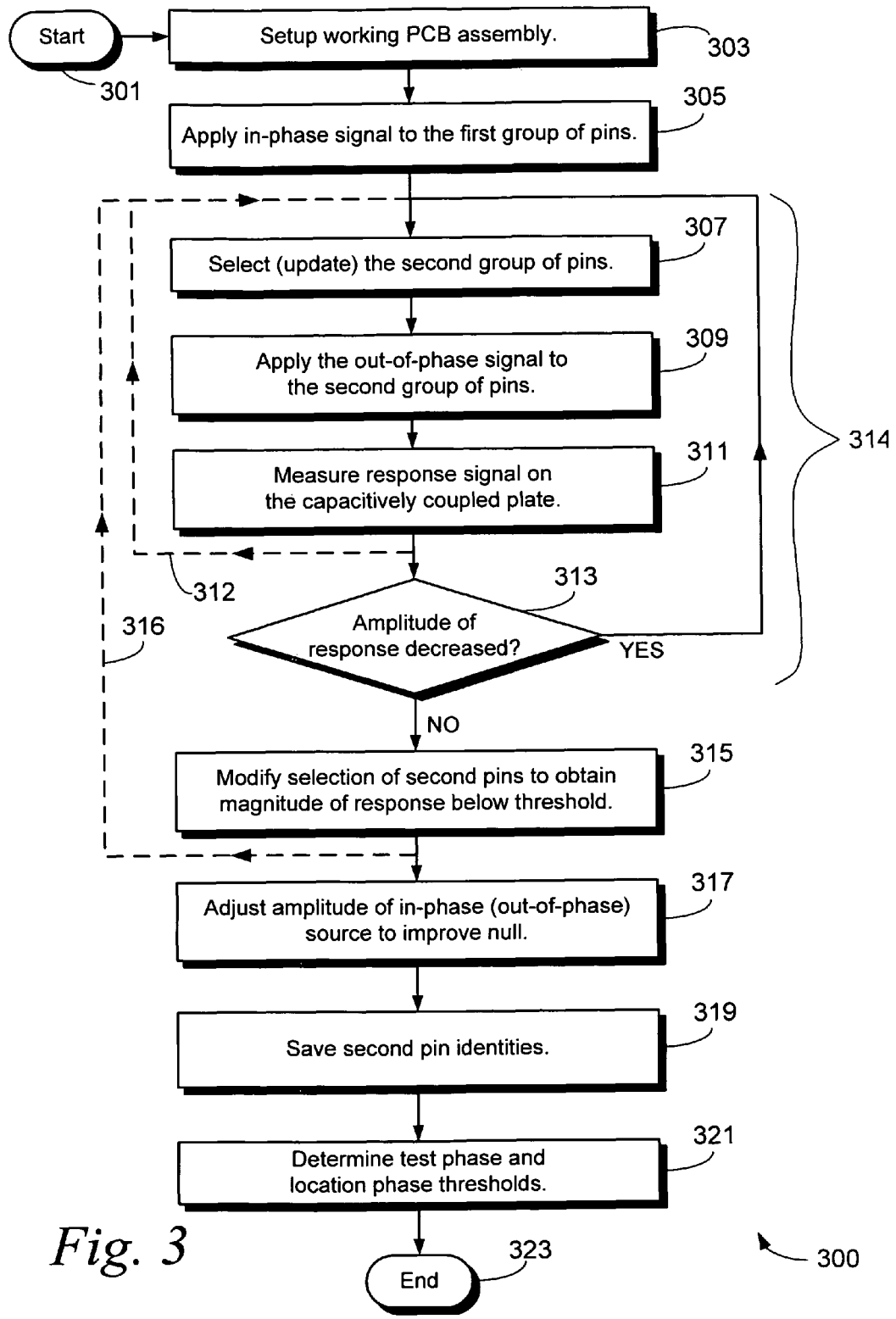
FIG. 3 is a flow diagram illustrating a method for determining members of the second group of pins, the amplitude of the signals, and the threshold value according to some embodiments.

A method 300 for performing the learn phase is illustrated as a flow diagram in FIG. 3. Method 300 may be performed using the test setup 130 (FIGS. 1-2). In some embodiments, computer 120 is programmed to perform method 300. The program may be stored as computer-executable instructions that may be stored on storage media 121 and/or memory 123. The instructions may be executed at suitable times by processing unit 125.

Method 300 is described in conjunction with FIGS. 4A-4H, which illustrate examples of some steps of the method. It should be appreciated that FIGS. 4A-4H illustrate but one example of the method 300, and that method 300 may be performed in any suitable way. In FIGS. 4A-4H, only switches 11-17 are labeled, however, it should be understood that features depicted as in FIG. 2 are similarly referenced. While the response signal is depicted in each of FIGS. 4A-4H, it should be understood that this is primarily for illustrative purposes. In some embodiments, an output, such as for example that that depicted, may be provided.

Method 300 begins at step 301.

At step 303, a working PCB assembly 100 is placed in the test setup 130. On a working PCB assembly all pins of a component 101 to be tested are properly connected to the PCB assembly. Setting up the PCB assembly may include positioning a detector plate 103 near the component 101 and connecting leads 114 and 116 to test points on the PCB assembly 100.

At step 305, an in-phase signal is applied to a first group of pins. In some embodiments, the pins in the first group of pins are connected in parallel. For example, the first group of pins may be connected in parallel by a net on PCB assembly 100 to which multiple pins of component 101 are connected. In some embodiments, the pins in the first group of pins are power pins. In some embodiments, the pins in the first group of pins are ground pins. The in-phase signal, $V_{OUT2}$, may be supplied by closing switch 17 and connecting signal generator 115 to the first group of pins. The in-phase signal may be an analog signal or a digital signal. In some embodiments, the in-phase signal may be an analog signal such as a sinusoid repeating at a frequency in the range of 5 to 20 KHz, for example, 9.5 KHz. However, the in-phase signal may be of any suitable shape and repeat with any suitable frequency. The signal generator 115 may generate the in-phase signal with any suitable amplitude. In some embodiments, the amplitude is less than a voltage that turns on a semiconductor device within the component. For example, the peak amplitude may be in the range of 100 to 300 mV. The in-phase signal may be a digital signal generated by a digital driver. In some embodiments, the digital driver provides an in-phase signal that alternates polarity. For example the signal may switch between −200 mV and +200 mV.

Figure 4A:
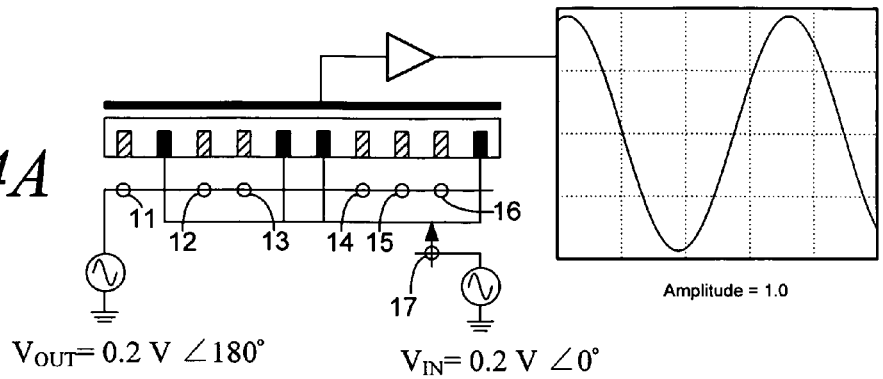
FIGS. 4A-4H illustrate different configurations of a test setup during a learn phase according to some embodiments.

FIG. 4A illustrates a portion of the test setup 130 after performing step 305 in conjunction with a response measured with that setup. Switch 17 is closed connecting the in-phase signal to the first group of pins which are connected in parallel. The response signal coupled to the detector plate is large and unbalanced.

Steps 307-313 are performed iteratively as part of loop 314.

At step 307, a second group of pins is selected. The second group of pins may include pins that may be individually connectable to the out-of phase signal generator 113. For the purpose of description, the pin of the second group are said to be selected from among "signal pins" on the component 101. However, the function of the pins is not critical to the invention. The second group of pins may be selected in any suitable way. For example, a single pin may be selected randomly from the signal pins. Preferably a smaller number of pins than the number of pins in the first group of pins is selected for the second group during the first iteration of loop 314.

At step 309, an out-of-phase signal is applied to the second group of pins. The out-of-phase signal, $V_{OUT1}$, may be generated by signal generator 113. The out-of-phase signal may be of the same shape, amplitude, and frequency as the in-phase signal applied at step 305, but approximately 180° out-of-phase with the in-phase signal. For example, if the in-phase signal is a digital signal that alternates polarity, the out-of-phase signal alternates to maintain the opposite polarity.

At step 311, the response signal is measured on the detector plate 103. Measuring may include suitably conditioning the response signal for analysis. For example, the response signal may be buffered, filtered, amplified and digitized by buffer 209, filter 203, amplifier 205, and ADC 207, respectively. In some embodiments, the Fourier transform of the response signal is calculated at the frequency of the in-phase and out-of-phase signals to determine the amplitude of the response signal. For example, the discrete Fourier transform (DFT) may be applied to the digitized response signal to determine the amplitude.

Figure 4B:
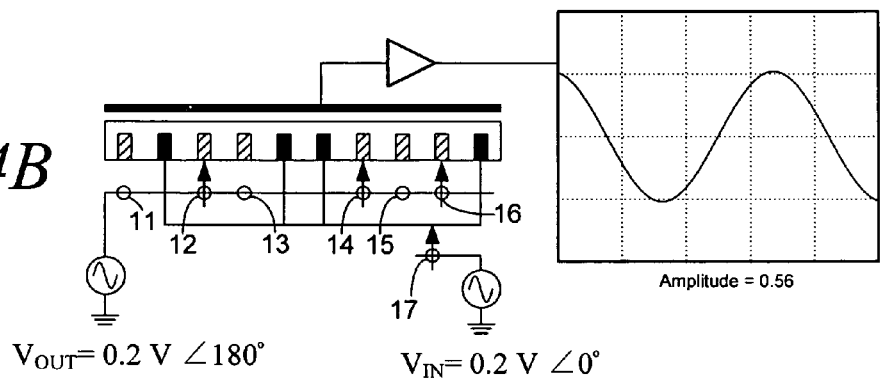

FIG. 4B illustrates a portion of the test setup 130 after performing steps 307, 309, and 311. In this example, the signal pins available for selection for the second group of pins are pins 1, 3, 4, 7, 8, and 9, of which pins 3, 7, and 9 are shown selected for the second group of pins (step 307). The switches 12, 14, and 16, corresponding to the second group of pins are closed to apply the out-of-phase signal (step 309). The response signal measured is also illustrated (step 311). As can be seen from the comparison of the measured response indicated in FIGS. 4A and 4B, coupling an out-of-phase signal to pins in a second group reduced the magnitude of a measured response. However, a significant response is nonetheless detected.

Multiple iterations of loop 314 may be performed to bring the response close to a predetermined value, which is a null in this example. In the first iteration of loop 314, path 312 may be followed to repeat the loop 314 and skip step 313. The loop thus repeats beginning at step 307.

In subsequent iterations of loop 314, at step 307, the group of second pins has different members. Here different combinations of pins are selected by adding one or more additional pins to the group of second pins in each iteration. Though any suitable approach may be used to form different groups. Steps 309 and 311 are performed in each iteration as described above.

In the second and subsequent iterations, processing will reach step 313. At step 313, a determination is made of whether the amplitude of the response signal has decreased with respect to the amplitude obtained in a previous iteration of loop 314. For example, the amplitudes calculated by DFT may be compared.

Figure 4C:
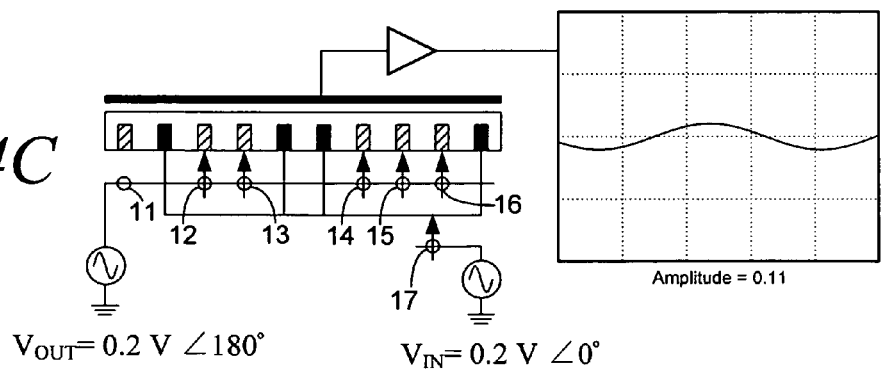

FIG. 4C illustrates a portion of the test setup 130 after a second iteration of loop 314. Pin 8 has additionally been connected to the out-of-phase signal generator by closing switch 15. The amplitude has decreased and thus at step 313, it is determined that loop 314 should be repeated for a third iteration.

Figure 4D:
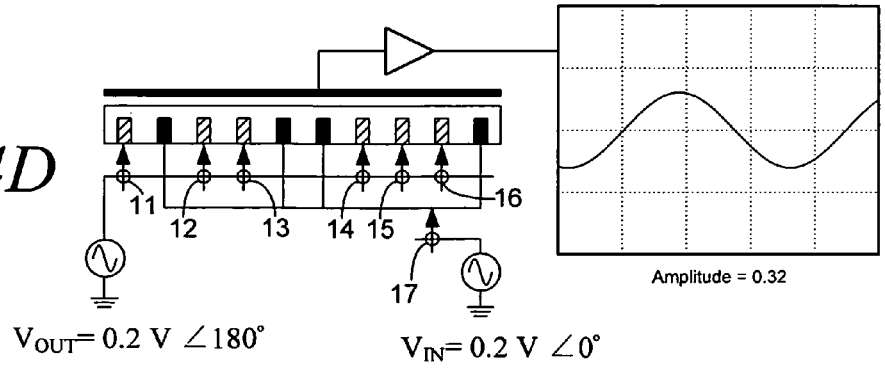

FIG. 4D illustrates a portion of the test setup 130 after a third iteration of loop 314. Pin 1 has additionally been connected to the out-of-phase signal generator by closing switch 11. At step 313 it is determined that the amplitude of the response signal has not decreased, and the loop 314 is not repeated. The method 300 thus continues to step 315.

The group of pins that yielded a response closest to a null may be selected as the second group of pins to be used during testing. Though, in some embodiments, more complex strategies may be used to select a group of pins that yields a result as close to the desired value as possible. Optionally, at step 315 a group of pins different than those initially selected at block 302 may be selected, and loop 314 may be repeated to determine whether a group of pins leading to a better null can be formed. In some embodiments of the learn phase, the second group of pins may be obtained by exhaustively testing all possible selections of the second group of pins. For example, component 101 shown in FIG. 2 has 6 signal pins implying there are 63 combinations of signal pins to consider. Though, in some embodiments a useful second group may be identified without exhaustive testing of all possible groups. In some embodiments, the number of groups tested may be reduced to a subset of the theoretical maximum number of groups. For example, tests may be limited to second groups consisting of a number of pins in a predetermined range. For example, limiting tests to second groups containing only 3 to 5 pins would reduce the number of combinations to 41.

Optionally, the amplitude of the response signal for the modified group of second pins is compared to a predetermined threshold. If the amplitude is too large, the selection of the group of second pins may be further modified. In some embodiments, the loop 314 is returned to (path 316). However, initially at step 307 the second group of pins for an earlier iteration of loop 314 is modified by adding fewer and/or different pins then those used in the second to last iteration. If the response is below the threshold method 300 continues to step 317.

Regardless of how a second group is selected, further processing may be performed to better achieve a "null" response. At step 317, the amplitude of either the in-phase or out-of-phase signal may be adjusted to improve the null. For example the peak to peak voltage may be increased or decreased for either the in-phase or out-of-phase signal. In some embodiments, the amplitude of the response signal after the amplitude has been adjusted is stored.

Figure 4E:
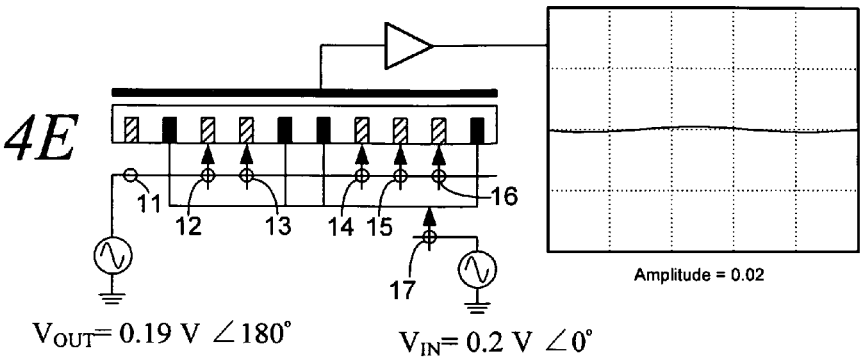

FIG. 4E illustrates a portion of the test setup 130 after completion of steps 315 and 317. As can be seen in FIG. 4E, a group of pins and magnitudes and phases of the stimulus signals has been selected to substantially provide an identifiable value of a response, here is "null."

At step 319, the identity of the members of the second group of pins and the amplitude and phase of the modified signal are saved. This information may be used in a subsequent test phase. In some embodiments, the information is stored on storage media 121 or memory 123 of computer 120.

At step 321, the test phase and optionally location phase thresholds are determined. The threshold for the test phase may represent an amplitude of the response signal above which it is deemed that there is a fault in the first group of pins. The location phase thresholds may be used to judge the amplitude of the change of a response signal when a test signal is applied to a signal pin. A response signal exceeding the threshold indicates that the signal pin is adjacent an open parallel pin. The one or more thresholds may be determined in any suitable way.

In some embodiments, a test phase threshold is estimated by simulating the effect of an open pin. The effect of an open pin in the first group of pins may be simulated by disconnecting pins from the second group of pins one at a time. For example, the amplitude of the response signal is measured when one of the pins from the second group of pins is disconnected. The measurement may be repeated by reconnecting the pin and disconnecting another pin in the second group of pins and measuring the amplitude of the response signal. This measurement may be repeated for each of the pins in the second group of pins. In some embodiments, multiple pins are disconnected simultaneously. The measured amplitudes may be used to determine the one or more thresholds for use in the test phase. For example, in some embodiments the average amplitude of the response signal, when one pin from the second group of pins is disconnected, is used to set the threshold. For example, the minimum amplitude among the measured amplitudes may be used as the threshold. Though the average response or one standard deviation below the average may alternatively be used as the selected threshold.

Figure 4F:
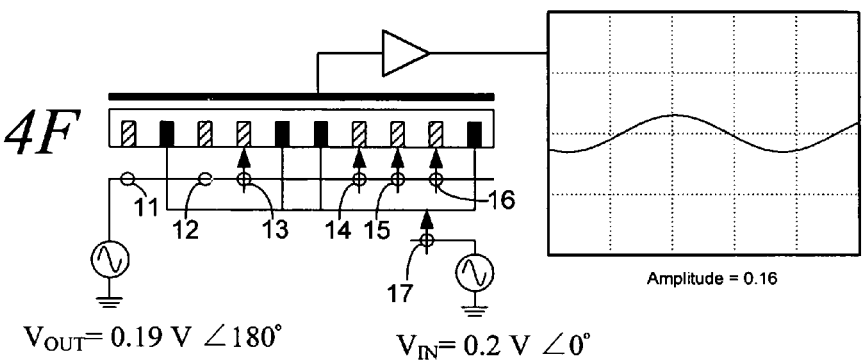
Figure 4G:
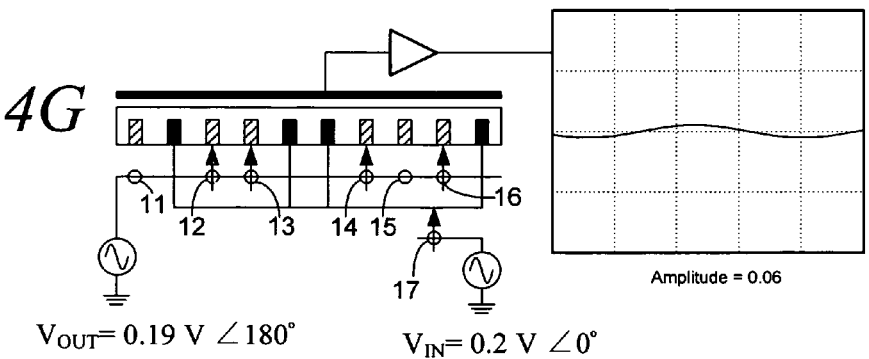
Figure 4H:
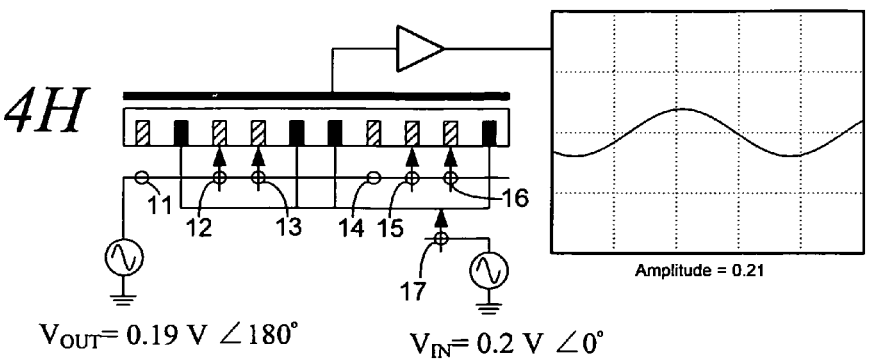

FIGS. 4F-4G illustrate a portion of the test setup 130 during performance of step 321. In FIG. 4F, pin 3 is disconnected by opening switch 12. The response is then measured. In FIG. 4G, pin 8 is disconnected by opening switch 15. Notice that switch 12 is closed reconnecting pin 3. The response is then measured. In FIG. 4H, pin 7 is disconnected by opening switch 14. The response is then measured. Pin 9 (switch 16) could similarly be tested (not shown).

Thresholds for use in the localization phase may be determined by measuring responses when a stimulus signal is coupled to each signal pin without a corresponding signal or other signal pins or the parallel connected pins. An upper limit to the expected response may be determined and stored as a threshold for use in conjunction with that pin, in a location phase, as described below.

Figure 5:
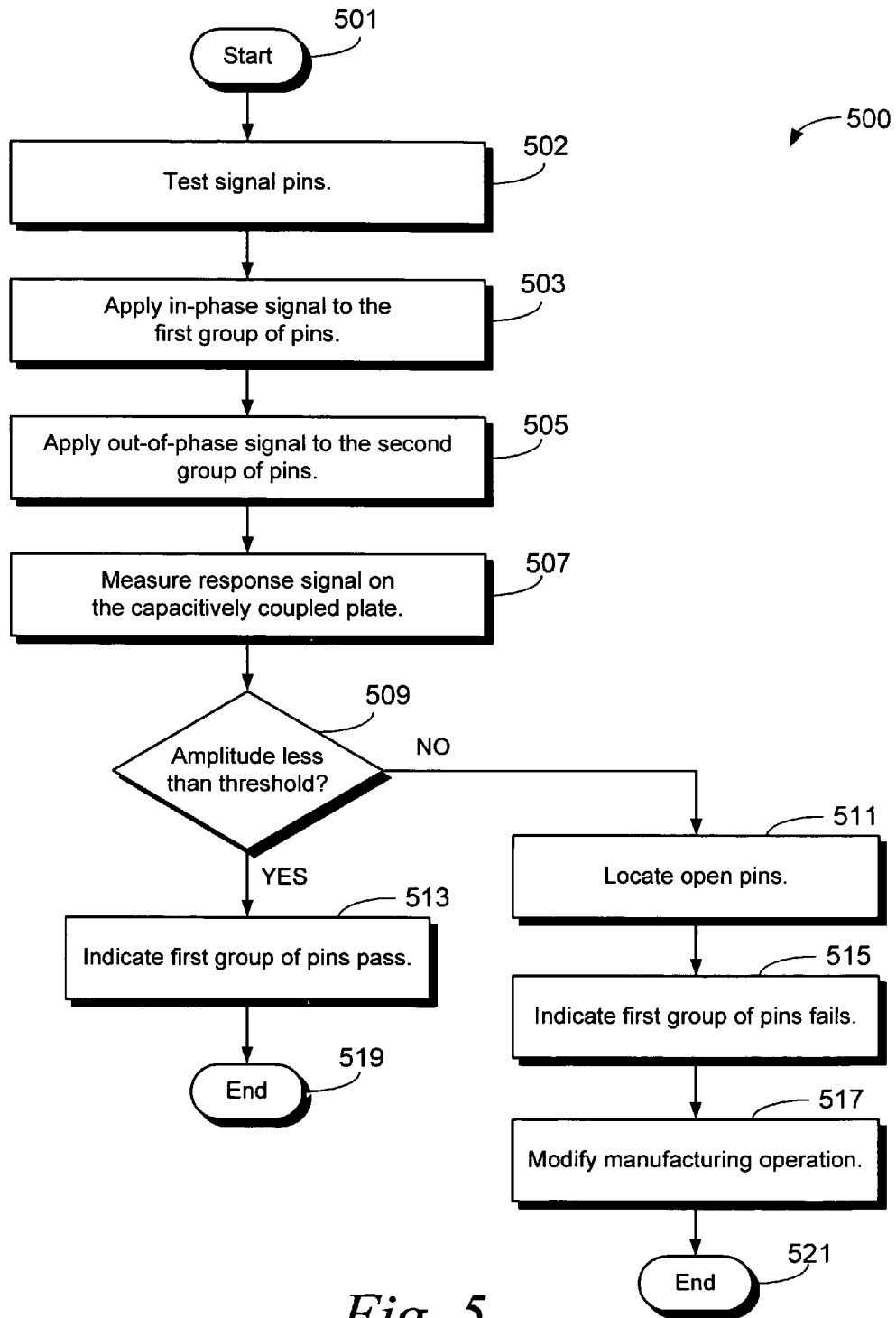
FIG. 5 is a flow diagram illustrating a method for determining if the members of a group of parallel connected pins are good according to some embodiments.

After completing the learn phase, the test phase may be performed. The test phase may be performed after a solder reflow portion of a manufacturing process. In some embodiments, the test phase is performed according to method 500 shown in FIG. 5. Though, the test phase may be performed at any suitable time. Method 500 may be performed using the test setup 130 (FIGS. 1-2). Method 500 may be performed for a PCB assembly 100 of unknown quality. This PCB assembly is placed in the test setup 130. Setting up the PCB assembly may include positioning a detector plate 103 near the component 101 and connecting leads 114 and 116 to test points on the PCB assembly 100. In some embodiments, computer 120 is programmed to perform method 500. The program may be stored as computer-executable instructions that may be stored on storage media 121 and/or memory 123. The instructions may be executed at suitable times by processing unit 125.

Method 500 begins at step 501.

At step 502, the signal pins of component 101 are tested. Any suitable test method may be used. In some embodiments, a capacitive testing technique as is known in the art is used. In some other embodiments, an impedance testing technique may be used.

If all the signal pins identified as pins in the second group of pins in the learn phase pass, method 500 continues to step 503. If some of the pins in the second group of pins fail, method 500 may be aborted. Though, in some embodiments, if a pin of the second group is faulty, the parallel opens test may proceed based on an alternative second group previously identified.

At step 503, an in-phase signal is applied to the first group of pins. The first group of pins may correspond to the same pins as the first group of pins in the learn phase. Preferably the in-phase signal is the same signal applied to the first group of pins in the learn phase at step 305. If the amplitude of the in-phase signal was modified in the learn phase (e.g., at step 317 of method 300), the in-phase signal is applied with the modified amplitude.

At step 505 an out-of-phase signal is applied to the second group of pins. The second group of pins may correspond to the second group of pins determined in the learn phase. For example, the pins stored at step 319 of method 300. Preferably the out-of-phase signal is the same signal applied to the second group of pins in the learn phase. If the amplitude of the out-of-phase signal was modified in the learn phase (e.g., at step 317), the out-of-phase signal is applied with the modified amplitude.

At step 507, the response signal is measured. Step 507 may include suitably conditioning the response signal for analysis. For example, the response signal may be buffered, filtered, amplified, and digitized by buffer 209, filter 203, amplifier 205, and ADC 207, respectively. In some embodiments, the Fourier transform of the response signal is calculated at the frequency of the in-phase and out-of-phase signals to determine the amplitude of the response signal. For example, the discrete Fourier transform (DFT) may be applied to the digitized response signal.

At step 509, it is determined if the amplitude of the response signal is less than a threshold. For example, the amplitude calculated by DFT in step 507 may be compared to a threshold determined during the learn phase for the group of parallel pins being tested.

If it is determined at step 509 that the amplitude is less than the threshold, step 513 is performed. At step 513, it is indicated that the first group of pins pass. The test phase indicates that each of the first group of pins have a good electrical connection to the PCB assembly 100. In some embodiments, the indication may be written to a file stored in a memory, such as storage media 121 or memory 123, or provided on output device 140. For example, an indication that the test was successful may be displayed on a screen or console. After performing step 513, the method 500 ends at step 519.

If it is determined at step 509 that the amplitude is greater than the threshold, step 511 is performed. If processing reaches step 511, it has been determined that there is at least one open pin among the first group of pins. An open pin has a poor electrical connection or does not have any electrical connection to a corresponding trace on the PCB assembly. The regions of the component 101 where an open pin in the first group of pins is likely to be found may be identified as part of a location phase. In some cases it is possible to identify a specific pin or pins as open. Some embodiments of the location phase are subsequently described with reference to method 600.

At step 515, it is indicated that the first group of pins fails. This indication may be made in any suitable way. In some embodiments, the indication may be written to a file stored in a memory, such as storage media 121 or memory 123, or provided on output device 140. For example, the indication may be displayed on a screen or console.

At step 517 the manufacturing operation is modified. For example, a faulty PCB assembly may be routed for rework. After step 517, the method 500 ends at step 521.

Figure 6:
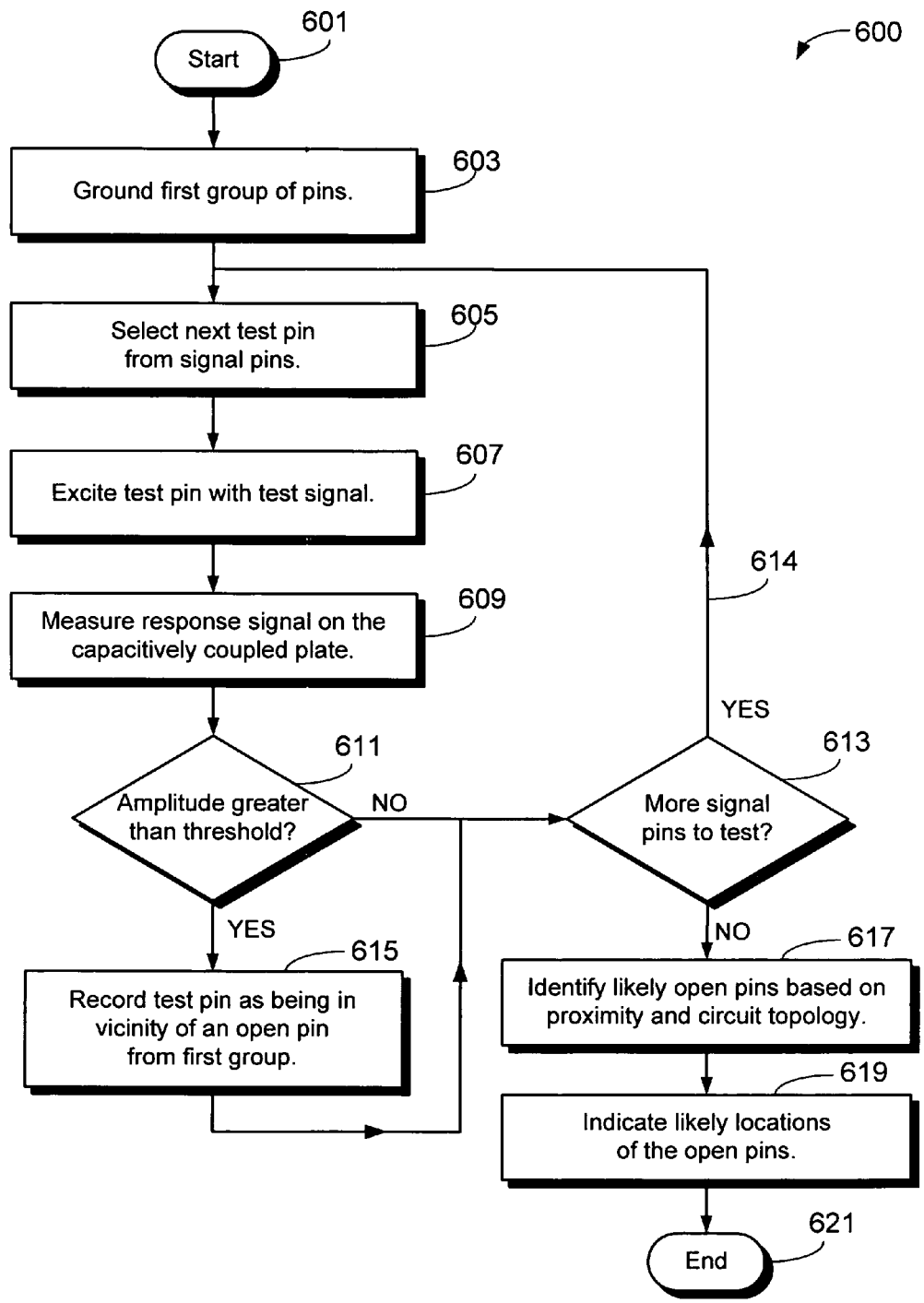
FIG. 6 is a flow diagram illustrating a method for identifying likely locations of an open pin(s) among the group of parallel connected pins according to some embodiments.

When it is determined during the test phase that the first group of pins fails, this may indicate the first group of pins includes at least one open pin. To identify the open pin or pins, a location phase may be performed. In some embodiments of the location phase, method 600, shown as a flow diagram in FIG. 6, is performed. When the test phase is performed according to method 500, method 600 may be viewed as an embodiment of step 511.

In some embodiments, computer 120 is programmed to perform method 600. The program may be stored as computer-executable instructions that may be stored on storage media 121 and/or memory 123. The instructions may be executed at suitable times by processing unit 125.

The method 600 begins at step 601.

At step 603, the first group of pins is connected to ground. Some embodiments of method 600 may be performed with the first group of pins connected to ground so as to shunt an input signal away from the detector plate. When the response signal is substantially larger than expected, it indicates that a nearby pin in the first group may be open since the shunting effect is not being achieved.

At step 605, a test pin is selected from among the signal pins. In some embodiments, multiple test pins may be selected. The test pin is preferably in close proximity to a pin in the first group of pins. For example, the test pin may be adjacent to a pin in the first group of pins. The proximity of signal pins may be known from a circuit topology, which may be stored in computer memory or consulted during programming of the test system.

At step 607, the test pin is excited with a test signal. The out-of-phase signal may be applied as used during the test phase. Therefore, the phase of the test signal is not critical during the localization phase. Though, the switch connecting the out-of-phase signal generator to the test pin may be closed while all other switches are open to disconnect the out-of-phase signal generator from the other pins.

At step 609, the response signal is measured. Measuring may include suitably conditioning the response signal for analysis. For example, the response signal may be buffered, filtered, amplified and digitized by buffer 209, filter 203, amplifier 205, and ADC 207, respectively. In some embodiments, the Fourier transform of the response signal is calculated at the frequency of the in-phase and out-of-phase signals to determine the amplitude of the response signal. For example, the discrete Fourier transform (DFT) may be applied to the digitized response signal.

At step 611 the amplitude of the response signal is compared to a threshold. The threshold represents an amplitude, or equivalent thereof, above which it is determined the test pin is in the vicinity of an open pin in the first group. The threshold may be determined in any suitable way. In some embodiments the threshold may be specific to the selection of the test pin. In some embodiments, the threshold is determined in the learn phase. For example, the threshold may be determined at step 321 of method 300.

If it is determined at step 611 that the amplitude is greater than the threshold, step 615 is performed. At step 615 it is recorded that the test pin is in vicinity of an open pin from the first group of pins.

After step 615 or if it is determined at step 611 that the amplitude is less than the threshold, step 613 is performed. At step 613, a determination is made whether there are more pins to test. If so, path 614 is followed back to step 605 where another signal pin is selected for testing.

If it is determined at step 613 that there are no further pins to test, step 617 is performed. At step 617, likely open pins in the first group of pins are identified based on the proximity of pins recorded in step 615 and the circuit topology. The circuit topology may indicate the locations of each of the test pins and each of the pins in the first group of pins. Any suitable heuristic may be used to select parallel pins adjacent the indicated test pins.

At step 619, the likely location of open pins in the first group of pins is indicated. For example, an indication may be written to a file stored in memory or provided on output device 140. Method 600 ends at step 621.

Having thus described at least one illustrative embodiment of the invention, various alterations, modifications, and improvements will readily occur to those skilled in the art.

For example, FIG. 3 illustrates a process by which a second group of pins is identified by iteratively adding pins to the group. Other strategies may be used for identifying an appropriate second group. In some embodiments, the phase of the response signal may be used to determine if pins should be added to or removed from the second group. Such alterations, modifications, and improvements are intended to be within the scope of the invention. Accordingly, the foregoing description is by way of example only and is not intended as limiting. The invention is limited only as defined in the following claims and the equivalents thereto.

What is claimed is:

1. A method of testing a circuit assembly comprising a component with a plurality of pins, the method comprising:
    applying a first signal to a first group of the plurality of pins;
    concurrently with applying the first signal, applying a second signal to a second group of the plurality of pins, the second signal being out of phase with the first signal;
    with a probe positioned adjacent the component, sensing a response signal, the response signal being in response to the first signal and the second signal as capacitively coupled to the probe from the first group and the second group, respectively; and
    indicating a test result based on a level of the response signal.

2. The method of claim 1, wherein the second signal is out of phase with the first signal by half a cycle.

3. The method of claim 1, wherein the component comprises a connector.

4. The method of claim 1, wherein the first group of the plurality of pins are electrically connected together in the circuit assembly.

5. The method of claim 4, wherein the first group of the plurality of pins is a group of power pins.

6. The method of claim 4, wherein the first group of the plurality of pins is a group of ground pins.

7. The method of claim 1, wherein the second group of the plurality of pins is a group of signal pins.

8. The method of claim 7, wherein the group of signal pins are electrically separate with respect to each other within the circuit assembly.

9. The method of claim 1, wherein indicating a test result comprises indicating at least one of the pins in the first group is not electrically connected to a trace on a substrate of the circuit assembly.

10. The method of claim 1, wherein the probe comprises a plate.

11. The method of claim 10, wherein the plate is operably connected to an amplifier.

12. The method of claim 1, wherein the first signal oscillates at a frequency in the range of 5-20 KHz.

13. The method of claim 1, wherein the first signal is an analog sinusoidal signal.

14. The method of claim 13, wherein an amplitude of the first signal is less than an amplitude of a voltage to turn on a semiconductor device in the component.

15. The method of claim 1, wherein the first signal is a digital signal.

16. The method of claim 1, wherein the component comprises a socket.

17. A method of manufacturing circuit assemblies, the method comprising:
    testing circuit assemblies in accordance with the method of claim 1, the circuit assemblies being tested after a first portion of a manufacturing process has been performed; and
    for each circuit assembly tested, selecting steps in a second portion of the manufacturing process based on the indicated test result.

18. A method of testing a circuit assembly comprising a component with a plurality of pins, the method comprising:
    during a learn phase:
        determining a first group and a second group of the plurality of pins such that when a signal is applied to each of the pins in the first group and a signal of a complementary phase is applied to each of the pins in the second group, the signals coupled from the first group and the second group to a probe adjacent the component have a predetermined value; and
    during a test phase:
        applying a first signal to the first group of the plurality of pins;
        concurrently with applying the first signal, applying a second signal to the second group of the plurality of pins, the second signal being out of phase with the first signal;
        with a probe positioned adjacent the component, sensing a response signal, the response signal being representative of a combined level of the first signal and the second signal coupled from the first group and the second group, respectively; and
        indicating a test result based on the level of the response signal relative to the predetermined value.

19. The method of claim 18, wherein the second signal is out of phase with the first signal by half a cycle.

20. The method of claim 18, further comprising, during the learn phase, identifying a threshold, the threshold representative of a change in the response signal from the predetermined value when the second group is reduced by one or more pins, and
    wherein indicating the test result comprises comparing a difference between the response signal and the predetermined value to the threshold.

21. The method of claim 20, wherein identifying the threshold comprises:
   disconnecting the second signal from a successive pin in the second group; and
   measuring the response signal when each successive pin is disconnected.

22. The method of claim 18, further comprising storing a test plan for the circuit assembly, the test plan comprising first and second groups for each of a plurality of components on the circuit assembly.

23. The method of claim 18, wherein indicating comprises producing a human perceptible output.

24. The method of claim 18, wherein indicating comprises storing a result on a computer storage medium.

25. The method of claim 18, wherein when the test result indicates a pin in the first group is open, the method further comprises:
   a location phase, the location phase comprising:
   for a selected pin in the first group, applying a test signal to a pin in the second group that is adjacent the selected pin;
   with the probe positioned adjacent the component, measuring a level of the test signal coupled from the pin to the probe; and
   indicating that the selected pin in the first group is open when the level of the test signal coupled from the component to the probe is above a threshold.

26. The method of claim 25, wherein the location phase comprises iteratively repeating the acts of applying a test signal and measuring a level of the test signal coupled to the probe with a different one of the plurality of pins in the first group as the selected pin in each iteration until a selected pin is identified for which the level of the test signal coupled from the component to the probe is above the threshold.

27. The method of claim 18, wherein during the learn phase, identifying the second group of the plurality of pins comprises connecting, sequentially, signal pins to the second signal to achieve a response signal below a threshold, and adjusting a level of the first signal or the second signal to reduce the response signal, the reduced response signal defining the predetermined value.

28. A computer storage device comprising computer executable instructions that, when executed on a test system having a computer, control the test system to test a circuit assembly comprising a component with a plurality of pins according to a method comprising:
   applying a first signal to a first group of the plurality of pins;
   concurrently with applying the first signal, applying a second signal to a second group of the plurality of pins, the second signal being out of phase with the first signal;
   with a probe positioned adjacent the component, sensing a response signal, the response signal being in response to the first signal and the second signal as capacitively coupled to the probe from the first group and the second group, respectively; and
   indicating a test result based on a level of the response signal.

* * * * *